United States Patent
Isomoto

(10) Patent No.: US 7,898,806 B2
(45) Date of Patent: Mar. 1, 2011

(54) MOTOR CONTROLLER

(75) Inventor: Kenji Isomoto, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 47 days.

(21) Appl. No.: 12/439,767

(22) PCT Filed: Aug. 24, 2007

(86) PCT No.: PCT/JP2007/066417
§ 371 (c)(1),
(2), (4) Date: Mar. 3, 2009

(87) PCT Pub. No.: WO2008/029636
PCT Pub. Date: Mar. 13, 2008

(65) Prior Publication Data
US 2010/0053898 A1    Mar. 4, 2010

(30) Foreign Application Priority Data
Sep. 4, 2006 (JP) .................................. 2006-238649

(51) Int. Cl.
*H05K 7/20* (2006.01)
(52) U.S. Cl. ............... 361/697; 361/679.47; 361/695; 361/707; 361/719; 363/141; 165/80.3; 165/121
(58) Field of Classification Search ........... 361/679.46, 361/679.47, 679.48, 679.54, 688, 689, 690–697, 361/704, 707, 709–712, 715, 719, 720, 728, 361/736, 820; 165/80.3, 104.33, 185; 454/184; 257/706, 707, 713, 719, 721–724; 363/141, 363/143, 144; 174/16.3, 252, 52.01
See application file for complete search history.

(56) References Cited

U.S. PATENT DOCUMENTS

| 5,353 | A | * | 11/1847 | Younger | ............................ 68/31 |
| 4,769,557 | A | * | 9/1988 | Houf et al. | .................... 307/147 |
| 5,497,289 | A | * | 3/1996 | Sugishima et al. | ........... 361/709 |
| 5,699,609 | A | * | 12/1997 | Wieloch | .......................... 29/830 |

(Continued)

FOREIGN PATENT DOCUMENTS

JP    4-2050 U    1/1992

(Continued)

OTHER PUBLICATIONS

Office Action dated Dec. 3, 2010, issued in corresponding Chinese Application No. 200780032816.0.

*Primary Examiner* — Michael V Datskovskiy
(74) *Attorney, Agent, or Firm* — Sughrue Mion, PLLC

(57) ABSTRACT

There is provided a motor controller that can easily reduce the size and manufacturing cost of a motor controller by reducing the size of a heat sink without increasing the number of parts much.

The motor controller includes a heat sink, a plurality of power semiconductor modules that is in close contact with the heat sink, a substrate (6) that is electrically connected to the plurality of power semiconductor modules, and a fan (8) that generates the flow of external air and supplies cooling air to the heat sink. The heat sink is formed by the combination of two kinds of heat sinks that include a first heat sink (9) and a second heat sink (10), and at least one of the power semiconductor modules is in close contact with each of the first and second heat sinks (9) and (10).

6 Claims, 6 Drawing Sheets

U.S. PATENT DOCUMENTS

| | | | |
|---|---|---|---|
| 5,909,358 A * | 6/1999 | Bradt | 361/707 |
| 6,087,800 A * | 7/2000 | Becker et al. | 318/778 |
| 6,091,604 A * | 7/2000 | Plougsgaard et al. | 361/707 |
| 6,249,435 B1 * | 6/2001 | Vicente et al. | 361/717 |
| 6,320,776 B1 * | 11/2001 | Kajiura et al. | 363/141 |
| 6,359,781 B1 * | 3/2002 | Hoss et al. | 361/679.46 |
| 6,477,053 B1 * | 11/2002 | Zeidan et al. | 361/719 |
| 6,493,227 B2 * | 12/2002 | Nielsen et al. | 361/703 |
| 6,621,700 B1 * | 9/2003 | Roman et al. | 361/697 |
| 6,862,182 B1 * | 3/2005 | Roman et al. | 361/697 |
| 6,891,725 B2 * | 5/2005 | Derksen | 361/704 |
| 6,921,328 B1 * | 7/2005 | Nohara et al. | 454/184 |
| 6,970,356 B2 * | 11/2005 | Peng | 361/695 |
| 7,265,981 B2 * | 9/2007 | Lee | 361/707 |
| 7,265,985 B2 * | 9/2007 | Widmayer et al. | 361/721 |
| 7,679,886 B2 * | 3/2010 | Meier et al. | 361/623 |
| 7,733,650 B2 * | 6/2010 | Okayama et al. | 361/704 |

FOREIGN PATENT DOCUMENTS

| | | | |
|---|---|---|---|
| JP | 9-509014 A | | 9/1997 |
| JP | 11-318695 A | | 11/1999 |
| JP | 11318695 A | * | 11/1999 |
| JP | 2002-289750 A | | 10/2002 |
| JP | 2004-319822 A | | 11/2004 |
| JP | 2004-349548 A | | 12/2004 |
| JP | 2005-223004 A | | 8/2005 |

* cited by examiner (a)  (b)

(a)　　　(b)

(a)

(b)

MOTOR CONTROLLER

TECHNICAL FIELD

The present invention relates to a motor controller, such as an inverter device or a servo amplifier, which is generally operated by high-voltage power, and more particularly, to the structure where the size of a heat sink used in a motor controller is reduced and the number of all parts of a motor controller is reduced.

RELATED ART

A motor controller in the related art, for example, an inverter device is provided with a plurality of power semiconductor modules that are heat-generating parts, and a heat sink that cools the plurality of power semiconductor modules (for example, see Patent Document 1). Further, in order to reduce the number of all parts of the motor controller, it is effective to form the heat sink by die-casting that can form complicated shapes. Accordingly, die-casting has been generally used.

The motor controller in the related art, for example, the structure of an inverter device is shown in FIGS. 7 to 9.

In FIGS. 7 to 9, bosses $1a$, engaging portions $1b$, and fins $1c$ are formed at a heat sink 1. A substrate 6 is placed on the bosses $1a$, and fixed to the heat sink 1 by screws 7. First and second power semiconductor modules 2 and 4 are disposed on the heat sink 1, that is, on the lower surface of the substrate 6. Meanwhile, the power semiconductor module 2 is fixed to the upper surface of the heat sink 1 by screws 3 so as to be in close contact with the upper surface of the heat sink, and the power semiconductor module 4 is fixed to the upper surface of the heat sink 1 by screws 5 so as to be in close contact with the upper surface of the heat sink. Further, a fan 8 is fixed to the engaging portions $1b$, so that the cooling efficiency of the heat sink 1 is improved by supplying cooling air to the fins $1c$.

In this structure, the heat sink 1 is manufactured by die-casting and includes the bosses $1a$ for fixing the substrate 6 and the engaging portions $1b$ for fixing the fan 8, so that the number of all parts is reduced.

Patent Document 1: JP-A-2004-349548

DISCLOSURE OF THE INVENTION

Problems to be Solved by the Invention

However, the heat sink of the motor controller in the related art has the following problem.

That is, die-casting causes thermal conductivity to deteriorate and cannot make the pitch of fins too small. For this reason, cooling efficiency deteriorates and the size of the heat sink is not reduced. Accordingly, there has been limit on reducing the size of the motor controller by reducing the size of the heat sink.

The invention has been made to solve the above-mentioned problem, and provides a motor controller that can easily reduce the size and manufacturing cost of a motor controller by reducing the size of a heat sink without increasing the number of parts much.

Means for solving the Problems

In order to solve the above-mentioned problem, the invention has the following structure.

According to the invention of claim 1, there is provided a motor controller including:

a heat sink, a plurality of power semiconductor modules that is in close contact with the heat sink, a substrate that is electrically connected to the plurality of power semiconductor modules, and a fan that generates the flow of external air and supplies cooling air to the heat sink, characterized in that the heat sink is formed by the combination of two kinds of heat sinks that include a first heat sink and a second heat sink, and at least one of the power semiconductor modules is in close contact with each of the first and second heat sinks.

According to the invention of claim 2, there is provided the motor controller, characterized in that the first heat sink is a die-cast heat sink, and the second heat sink is made of a material having excellent thermal conductivity by an extruding or caulking method.

According to the invention of claim 3, there is provided the motor controller, characterized in that at least one heat sink of the first and second heat sinks includes fins.

According to the invention of claim 4, there is provided the motor controller, characterized in that the first and second heat sinks include fins, and the fins of the second heat sink are disposed downwind as compared to the fins of the first heat sink.

According to the invention of claim 5, there is provided the motor controller, characterized in that the pitch of the fins of the second heat sink is smaller than that of the fins of the first heat sink.

According to the invention of claim 6, there is provided the motor controller, characterized in that a thermal insulator is interposed between the two kinds of heat sinks.

EFFECTS OF THE INVENTION

According to the inventions, it is possible to obtain the following effects.

According to the inventions of claims 1, 2 and 3, the heat sink is formed by the combination of two kinds of heat sinks that include the first heat sink and the second heat sink, and the first heat sink is a die-cast heat sink that can be formed to have complicated shapes. Therefore, it is possible to easily form the bosses for fixing the substrate and the engaging portions for fixing the fan, so that the number of parts of the motor controller is reduced.

Further, the second heat sink is formed of a heat sink that has excellent thermal conductivity and is formed by an extruding or caulking method, so that it is possible to improve cooling efficiency, to reduce the size of the heat sink, and to reduce the size of the motor controller.

According to the invention of claim 4, the fins of the second heat sink of which the temperature easily becomes high due to good transfer of heat of the power semiconductor module having excellent thermal conductivity are disposed downwind as compared to the fins of the first heat sink. Therefore, the first heat sink is not affected by the second heat sink of which the temperature is high.

According to the invention of claim 5, the pitch of the fins of the second heat sink such as a caulk having excellent thermal conductivity is smaller than the pitch of fins that can be manufactured by die-casting. Therefore, the heat radiating area is increased, so that cooling efficiency is improved. As a result, it is possible to reduce the size of the heat sink, and to reduce the size of the motor controller.

According to the invention of claim 6, it is possible to prevent heat from being transferred between two heat sinks.

Therefore, the influence between the power semiconductor modules provided on the first and second heat sinks may be neglected, and it is possible to efficiently reduce the size of the heat sink and the size of the motor controller.

BRIEF DESCRIPTION OF THE DRAWINGS

FIG. 3 is a view showing the motor controller shown in FIG. 2, wherein FIG. 3(a) is a right side view and FIG. 3(b) is a rear view.

FIG. 6 is a view showing the motor controller shown in FIG. 5, wherein FIG. 6(a) is a right side view and FIG. 6(b) is a rear view.

FIG. 9 is a view showing the motor controller shown in FIG. 8, wherein FIG. 9(a) is a right side view and FIG. 9(b) is a rear view.

DESCRIPTION OF REFERENCE NUMERALS AND SIGNS

1: HEAT SINK
1a: BOSS
1b: ENGAGING PORTION
1c: FIN
2: FIRST POWER SEMICONDUCTOR MODULE
3: SCREW FOR FIXING FIRST POWER SEMICONDUCTOR MODULE
4: SECOND POWER SEMICONDUCTOR MODULE
5: SCREW FOR FIXING SECOND POWER SEMICONDUCTOR MODULE
6: SUBSTRATE
7: SCREW FOR FIXING SUBSTRATE
8: FAN
9: FIRST HEAT SINK
9a: BOSS
9b: ENGAGING PORTION
9c: HOLLOW HOLE
10: SECOND HEAT SINK
10a: FIN
11: SCREW FOR FIXING SECOND HEAT SINK
12: THERMAL INSULATOR

BEST MODE FOR CARRYING OUT THE INVENTION

Embodiments of the invention will be described below with reference to drawings.

Embodiment 1

Figure 1:
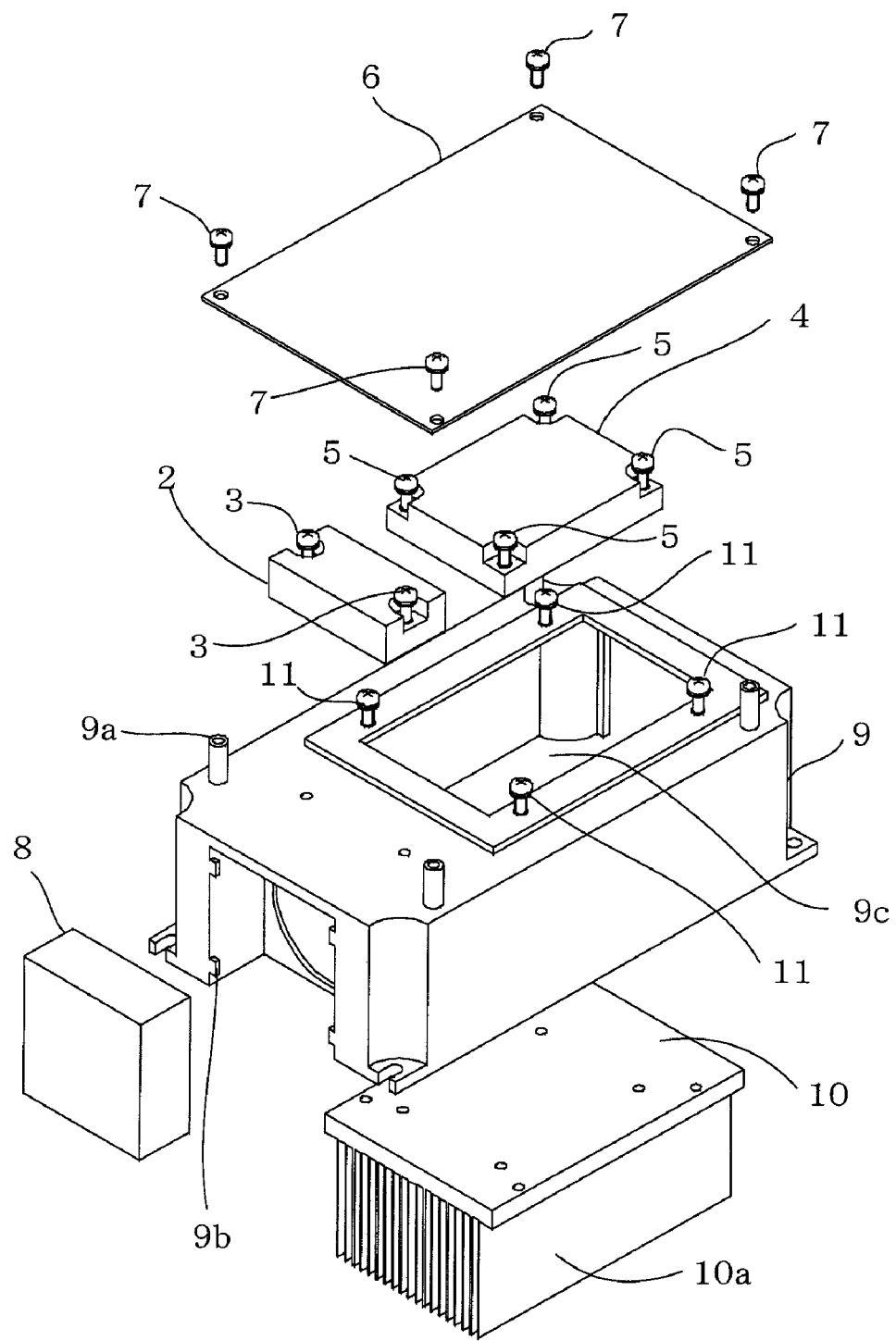
FIG. 1 is an exploded perspective view of a motor controller according to a first embodiment of the invention.

FIG. 1 is an exploded perspective view of a motor controller according to a first embodiment of the invention.

Figure 2:
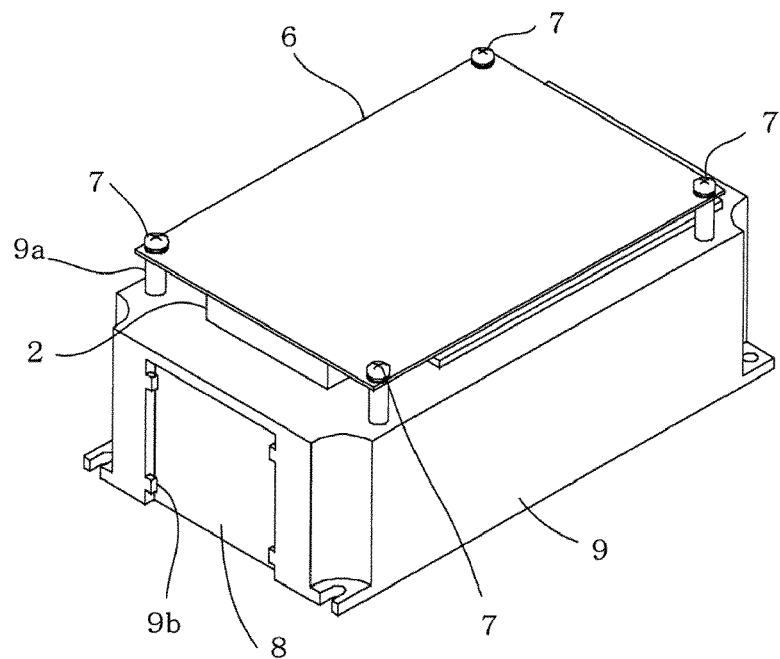
FIG. 2 is an assembled perspective view of the motor controller shown in FIG. 1.
Figure 3:
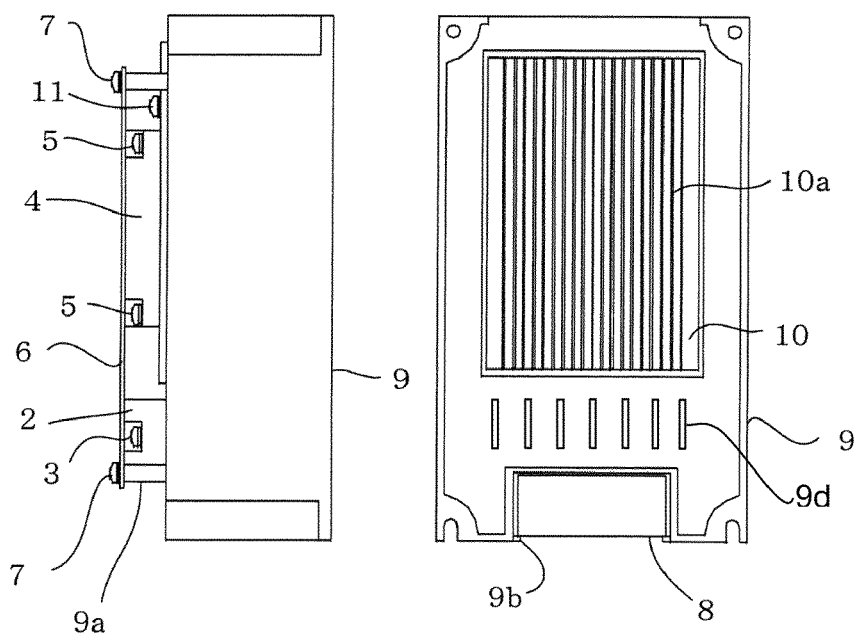

FIG. 2 is an assembled perspective view of the motor controller shown in FIG. 1. FIG. 3 is a view showing the motor controller shown in FIG. 2, wherein FIG. 3(a) is a right side view and FIG. 3(b) is a rear view.

In FIGS. 1 to 3, reference numeral 2 denotes a first power semiconductor module, reference numeral 4 denotes a second power semiconductor module, reference numeral 6 denotes a substrate, reference numeral 8 denotes a fan, reference numeral 9 denotes a first heat sink, and reference numeral 10 denotes a second heat sink.

Bosses 9a, engaging portions 9b, and a hollow hole 9c are formed at the first heat sink 9. The substrate 6 is placed on the bosses 9a, and fixed to the first heat sink 9 by screws 7. The first power semiconductor module 2 is disposed on the first heat sink 9, that is, on the lower surface of the substrate 6, and fixed to the upper surface of the first heat sink 9 by screws 3 so as to be in close contact with the upper surface of the first heat sink. The second power semiconductor module 4 is disposed on the second heat sink 10, and fixed to the upper surface of the second heat sink 10 by screws 5 so as to be in close contact with the upper surface of the second heat sink. The second heat sink 10 is disposed at a position corresponding to the hollow hole 9c of the first heat sink 9, and fixed to the first heat sink 9 by screws 11. Further, the second heat sink 10 is provided with fins 10a, and a fan 8 is fixed to the engaging portions 9b of the first heat sink 9. Accordingly, the cooling efficiency of the second heat sink 10 is improved by supplying cooling air to the fins 10c.

In this case, if a space required for providing fins 9d is formed at the first heat sink 9, the fins 9d are provided at the first heat sink 9 and the cooling efficiency of the first heat sink 9 may be improved by supplying cooling air, which is generated by the fan 8, to the fins 9d.

In this structure, the first heat sink 9 is manufactured by die-casting and includes the bosses 9a for fixing the substrate 6 and the engaging portions 9b for fixing the fan 8, so that it is possible to reduce the number of all parts of the motor controller. Further, a heat sink such as a caulk having excellent thermal conductivity is used as the second heat sink 10, and the pitch of the fins 10a is smaller than the pitch of fins that can be manufactured by die-casting. Accordingly, the heat radiating area of the second heat sink 10 is increased, so that cooling efficiency is improved. As a result, it is possible to reduce the size of the second heat sink 10.

Further, if a die-cast heat sink is used as the first heat sink 9 as described above or a heat sink that is made of a material having excellent thermal conductivity by an extruding or caulking method is used as the second heat sink 10, the fins 10a of the second heat sink 10 of which the temperature easily becomes high due to good transfer of heat of the power semiconductor module having excellent thermal conductivity are disposed downwind as compared to the fins (not shown) of the first heat sink 9. Accordingly, there is no deterioration of cooling performance of the first heat sink 9 that is caused by the influence of high-temperature air.

In this case, the first and second power semiconductor modules 2 and 4 generally have different amount of generated heat when being usually used. For this reason, a power semiconductor module having a large amount of generated heat is necessarily fixed to the heat sink 10 that has high cooling efficiency. That is, the second power semiconductor module 4 has a large amount of generated heat as compared to the first power semiconductor module 2. For this reason, the second power semiconductor module 4 is fixed to the second heat sink 10 having high cooling efficiency.

Furthermore, the failure limit temperature of the first power semiconductor module 2 may be different from that of the second power semiconductor module 4. Considering a case where the failure limit temperature of the second power semiconductor module 4 is higher than that of the first power semiconductor module 2, the temperature of the second heat sink 10 to which the second power semiconductor module 4 is fixed can be higher than that of the first heat sink 9 to which the first power semiconductor module 2 is fixed. Accordingly, if the size of the second heat sink 10 is reduced to the limit size, the temperature of the second heat sink 10 becomes higher than that of the first heat sink 9. In this case, since the first and second heat sinks 9 and 10 are discrete component parts even though being fixed to each other by screws, the first and second heat sinks have a certain degree of heat insulating effect therebetween. As a result, it is possible to prevent heat from being transferred from the second heat sink 10 of which the temperature is high to the first heat sink 9 of which the temperature is low, to some extent. For this reason, it is possible to eliminate the influence of the second heat sink 10 on the reduction of the size of the first heat sink 9, to some extent. Meanwhile, a case where the failure limit temperature of the first power semiconductor module 2 is higher than that of the second power semiconductor module 4 may be also considered in the same manner as described above.

Embodiment 2

Figure 4:
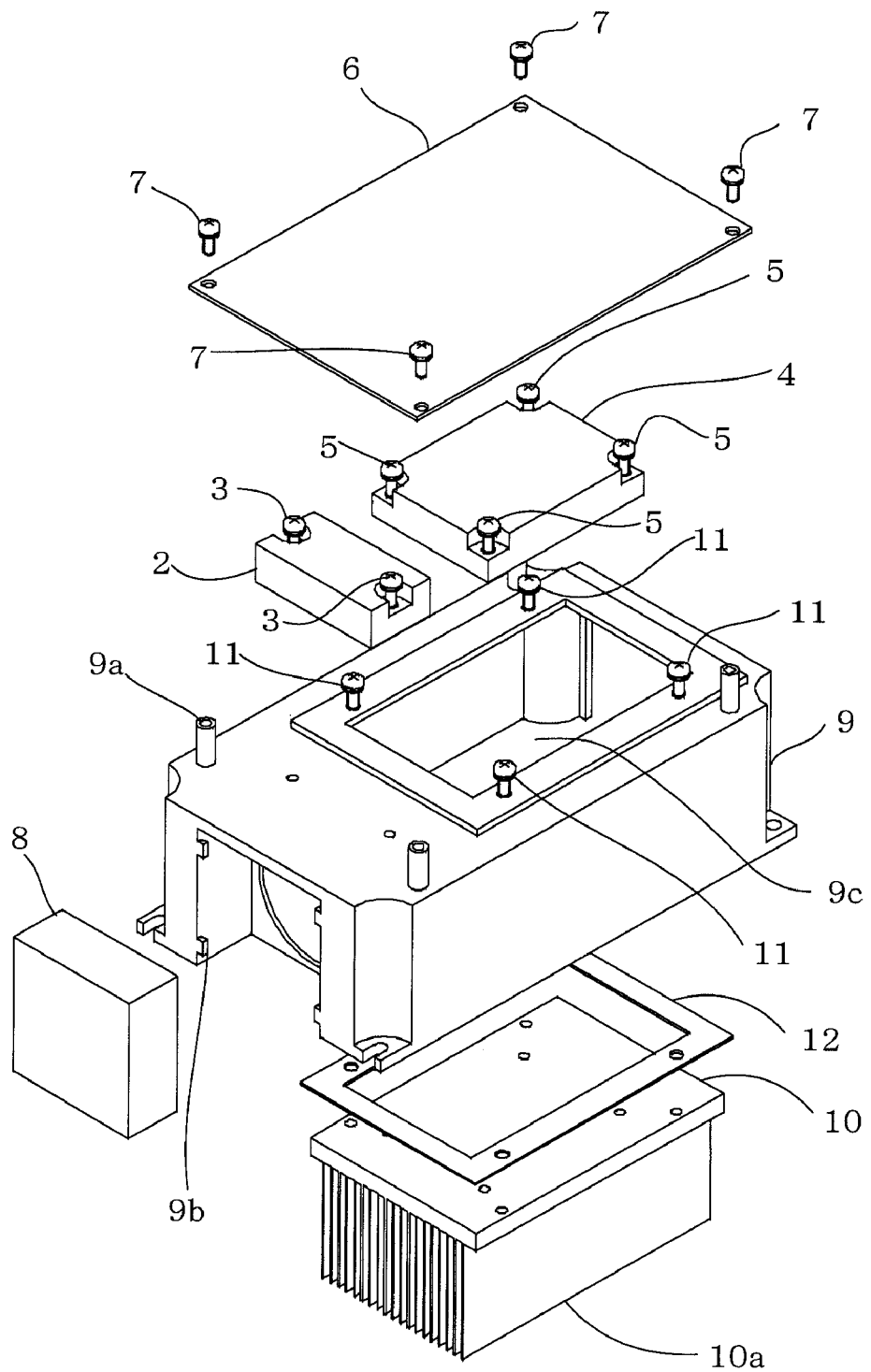
FIG. 4 is an exploded perspective view of a motor controller according to a second embodiment of the invention.
Figure 5:
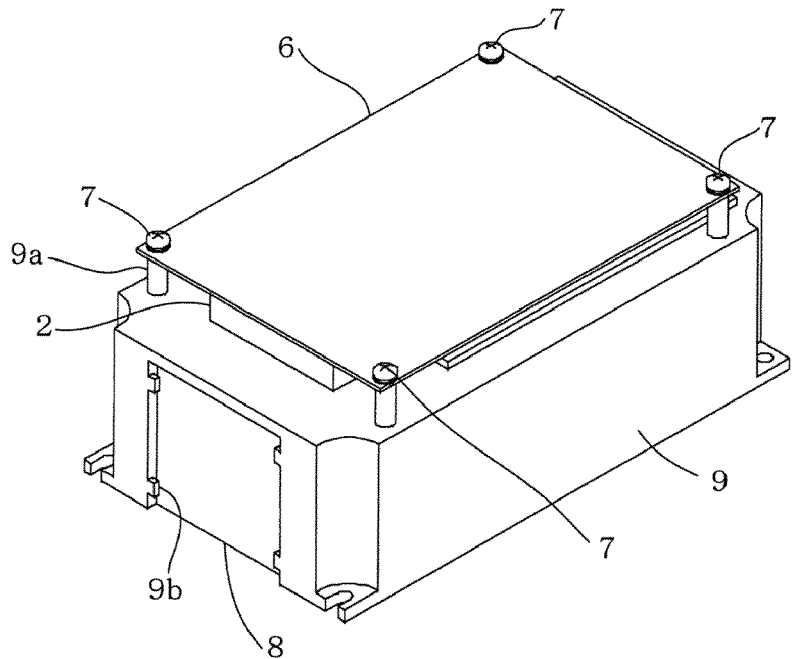
FIG. 5 is an assembled perspective view of the motor controller shown in FIG. 4.
Figure 6:
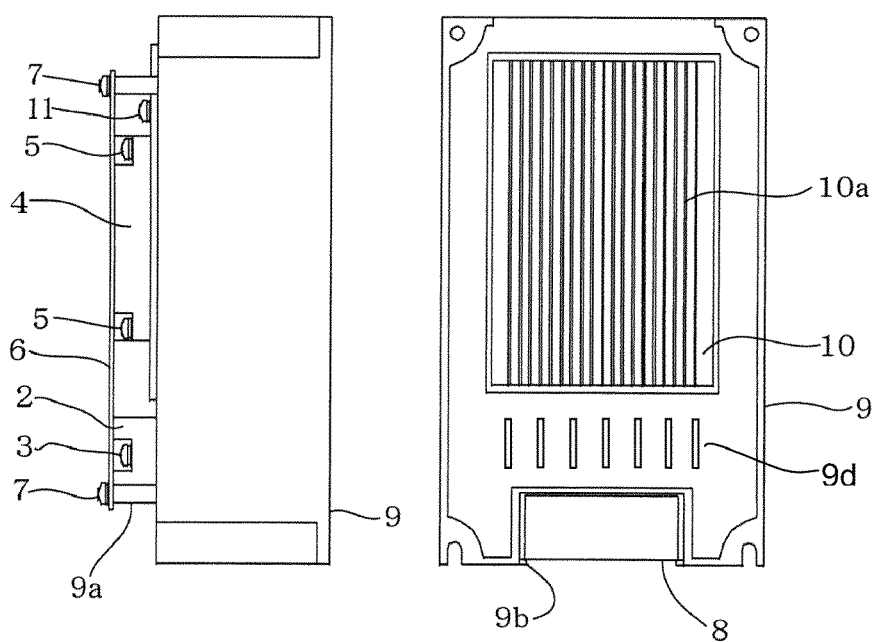
Figure 7:
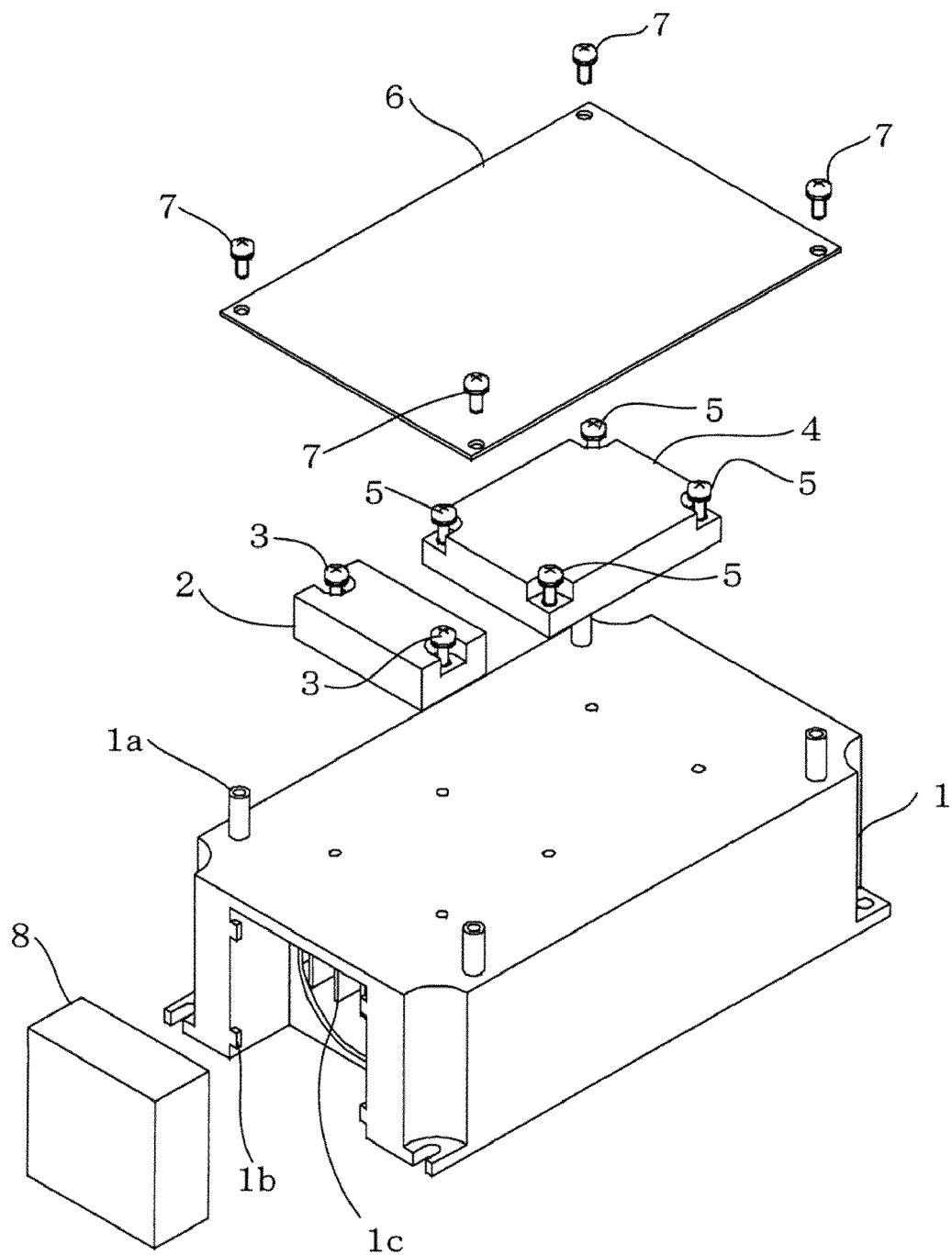
FIG. 7 is an exploded perspective view of a motor controller in the related art.
Figure 8:
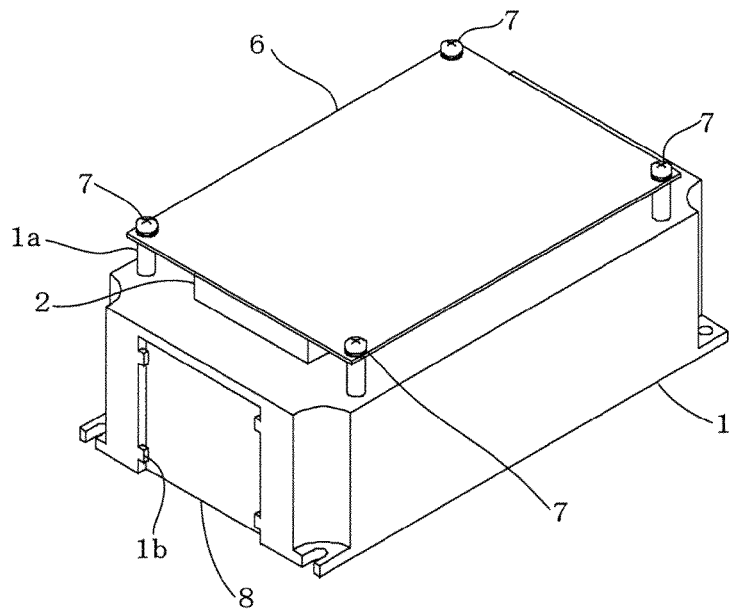
FIG. 8 is an assembled perspective view of the motor controller shown in FIG. 7.
Figure 9:
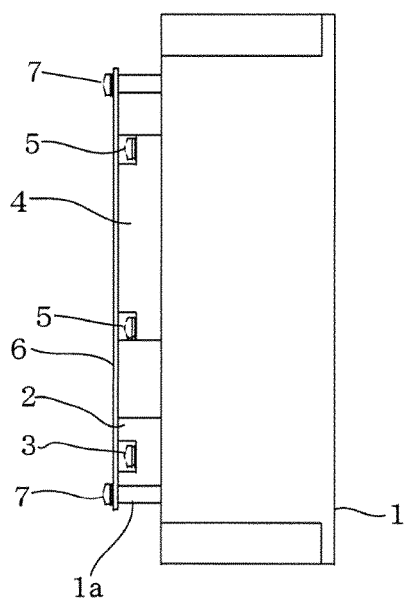
Figure 9:
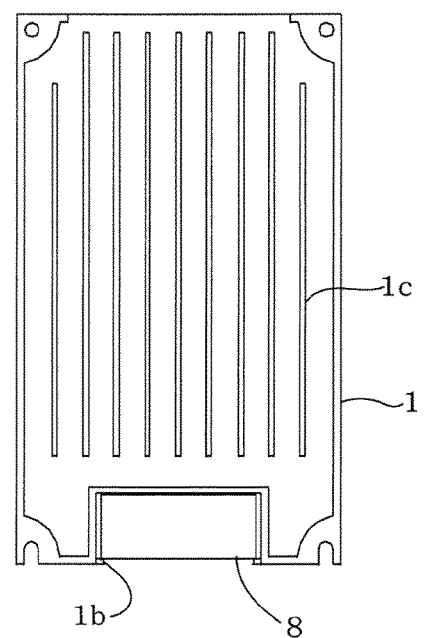

FIG. 4 is an exploded perspective view of a motor controller according to a second embodiment of the invention. FIG. 5 is a perspective view of the motor controller shown in FIG. 4. FIG. 6(*a*) is a right side view of the motor controller shown in FIG. 5, and FIG. 6(*b*) is a rear view of the motor controller shown in FIG. 5.

In FIGS. 4 to 6, reference numeral 2 denotes a first power semiconductor module, reference numeral 4 denotes a second power semiconductor module, reference numeral 6 denotes a substrate, reference numeral 8 denotes a fan, reference numeral 9 denotes a first heat sink, reference numeral 10 denotes a second heat sink, and reference numeral 12 denotes a thermal insulator.

Bosses 9*a*, engaging portions 9*b*, and a hollow hole 9*c* are formed at the first heat sink 9. The substrate 6 is placed on the bosses 9*a*, and fixed to the first heat sink 9 by screws 7. The first power semiconductor module 2 is disposed on the first heat sink 9, that is, on the lower surface of the substrate 6, and fixed to the upper surface of the first heat sink 9 by screws 3 so as to be in close contact with the upper surface of the first heat sink. The second power semiconductor module 4 is disposed on the second heat sink 10, and fixed to the upper surface of the second heat sink 10 by screws 5 so as to be in close contact with the upper surface of the second heat sink. The second heat sink 10 is disposed at a position corresponding to the hollow hole 9*c* of the first heat sink 9 with a thermal insulator 12 between the second heat sink and the first heat sink, and fixed to the first heat sink 9 by screws 11. Further, the second heat sink 10 is provided with fins 10*a*, and a fan 8 is fixed to the engaging portions 9*b* of the first heat sink 9. Accordingly, the cooling efficiency of the second heat sink 10 is improved by supplying cooling air to the fins 10*c*.

In this case, if a space required for providing fins 9*d* is formed at the first heat sink 9, the fins 9*d* are provided at the first heat sink 9 like in the above-mentioned first embodiment and the cooling efficiency of the first heat sink 9 may be improved by supplying cooling air, which is generated by the fan 8, to the fins 9*d*. In this case, the fins of the second heat sink of which the temperature easily becomes high due to good transfer of heat of the power semiconductor module having excellent thermal conductivity are disposed downwind as compared to the fins of the first heat sink. Accordingly, there is no deterioration of cooling performance of the first heat sink that is caused by the influence of high-temperature air.

In this structure, the first heat sink 9 is manufactured by die-casting and includes the bosses 9*a* for fixing the substrate 6 and the engaging portions 9*b* for fixing the fan 8, so that it is possible to reduce the number of all parts of the motor controller. Further, a heat sink such as a caulk having excellent thermal conductivity is used as the second heat sink 10, and the pitch of the fins 10*a* is smaller than the pitch of fins that can be manufactured by die-casting. Accordingly, the heat radiating area of the second heat sink 10 is increased, so that cooling efficiency is improved. As a result, it is possible to reduce the size of the second heat sink 10.

In this case, the first and second power semiconductor modules 2 and 4 generally have different amount of generated heat when being usually used. For this reason, a power semiconductor module having a large amount of generated heat is necessarily fixed to the heat sink 10 that has high cooling efficiency. That is, the second power semiconductor module 4 has a large amount of generated heat as compared to the first power semiconductor module 2. For this reason, the second power semiconductor module 4 is fixed to the second heat sink 10 having high cooling efficiency.

Furthermore, the failure limit temperature of the first power semiconductor module 2 may be different from that of the second power semiconductor module 4. Considering a case where the failure limit temperature of the second power semiconductor module 4 is higher than that of the first power semiconductor module 2, the temperature of the second heat sink 10 to which the second power semiconductor module 4 is fixed can be higher than that of the first heat sink 9 to which the first power semiconductor module 2 is fixed. Accordingly, if the size of the second heat sink 10 is reduced to the limit size, the temperature of the second heat sink 10 becomes higher than that of the first heat sink 9. In this case, since the first and second heat sinks 9 and 10 are discrete component parts even though being fixed to each other by screws, the first and second heat sinks have a certain degree of heat insulating effect therebetween. In addition, since the first and second heat sinks 9 and 10 are thermally insulated from each other by the thermal insulator 12, it is possible to substantially prevent heat from being transferred from the second heat sink 10 of which the temperature is high to the first heat sink 9 of which the temperature is low, to some extent. For this reason, it is possible to substantially eliminate the influence of the second heat sink 10 on the reduction of the size of the first heat sink 9. Meanwhile, a case where the failure limit temperature of the first power semiconductor module 2 is higher than that of the second power semiconductor module 4 may be also considered in the same manner as described above.

INDUSTRIAL APPLICABILITY

The invention relates to a motor controller, such as an inverter device or a servo amplifier, which is generally operated by high-voltage power, and more particularly, to the structure where the size of a heat sink used in a motor controller is reduced and the number of all parts of a motor controller is reduced. The invention may be used in a field related to the manufacture and provision of a motor controller that can easily reduce the size and manufacturing cost of a motor controller by reducing the size of a heat sink without increasing the number of parts much.

The invention claimed is:

1. A motor controller comprising:
a heat sink, a plurality of power semiconductor modules that is in close contact with the heat sink, a substrate that is electrically connected to the plurality of power semiconductor modules, and a fan that generates the flow of external air and supplies cooling air to the heat sink, wherein the heat sink is formed by the combination of two kinds of heat sinks that include a first heat sink and a second heat sink, and at least one of the power semiconductor modules is in close contact with one each of the first and second heat sinks.

2. The motor controller according to claim 1, wherein
the first heat sink is a die-cast heat sink, and
the second heat sink is made of a material having excellent thermal conductivity by an extruding or caulking method.

3. The motor controller according to claim 2, wherein
at least one heat sink of the first and second heat sinks includes fins.

4. The motor controller according to claim 3, wherein
the first and second heat sinks include fins, and
the fins of the first heat sink are disposed upwind as compared to the fins of the second heat sink.

5. The motor controller according to claim 4, wherein
the pitch of the fins of the second heat sink is smaller than that of the fins of the first heat sink.

6. The motor controller according to claim 1, wherein
a thermal insulator is interposed between the first and second heat sinks.

* * * * *